(12) United States Patent
Macias et al.

(10) Patent No.: US 6,577,159 B1
(45) Date of Patent: Jun. 10, 2003

(54) METHOD AND APPARATUS FOR AUTOMATIC HIGH-SPEED BYPASS ROUTING IN A CELL MATRIX SELF-CONFIGURABLE HARDWARE SYSTEM

(76) Inventors: Nicholas Jesse Macias, 1004 Palmer Dr., Blacksburg, VA (US) 24060; Murali Dandu Raju, 6508 Dearborn Dr., Falls Church, VA (US) 22044

( * ) Notice: Subject to any disclaimer, the term of this patent is extended or adjusted under 35 U.S.C. 154(b) by 28 days.

(21) Appl. No.: 10/127,512

(22) Filed: Apr. 22, 2002

(51) Int. Cl.[7] .............................................. H03K 19/177
(52) U.S. Cl. ............................................. 326/40; 326/38
(58) Field of Search .................................... 326/37–41

(56) References Cited

U.S. PATENT DOCUMENTS

| | | | | |
|---|---|---|---|---|
| 5,457,410 A | | 10/1995 | Ting | |
| 5,883,525 A | * | 3/1999 | Tavana et al. | 326/39 |
| 5,886,537 A | | 3/1999 | Macias et al. | |
| 6,054,871 A | * | 4/2000 | New | 326/39 |
| 6,216,259 B1 | | 4/2001 | Guccione et al. | |
| 6,292,022 B2 | | 9/2001 | Young et al. | |
| 6,297,667 B1 | | 10/2001 | Macias | |

* cited by examiner

*Primary Examiner*—Daniel Chang
*Assistant Examiner*—James H Cho

(57) ABSTRACT

A method and apparatus for enabling individual cells in a Cell Matrix to detect when they have been configured to act as a simple wire, and to bypass their internal logic accordingly. Such bypass conditions result in faster data transmission from input to output. When sets of adjacent cells are each configured to act as a wire, significantly faster transmission of data through the cells can be achieved by this bypass routing. Also disclosed is a means for selectively disconnecting unused inputs from internal logic, thereby further increasing switching speed across cells utilizing this bypass routing.

18 Claims, 9 Drawing Sheets

| 44 → | DS DN DE DW | CN CS CW CE DN DS DW DE | ← 46 |
|---|---|---|---|
| | 0 0 0 0 | 0 0 0 0 0 0 0 0 | — 50 |
| | 0 0 0 1 | 0 0 0 0 0 0 0 1 | — 52 |
| | 0 0 1 0 | 0 0 0 0 0 0 0 0 | |
| | 0 0 1 1 | 0 0 0 0 0 0 0 1 | |
| | 0 1 0 0 | 0 0 0 0 0 0 0 0 | |
| | 0 1 0 1 | 0 0 0 0 0 0 0 1 | |
| | 0 1 1 0 | 0 0 0 0 0 0 0 0 | |
| | 0 1 1 1 | 0 0 0 0 0 0 0 1 | |
| | 1 0 0 0 | 0 0 0 0 0 0 0 0 | |
| | 1 0 0 1 | 0 0 0 0 0 0 0 1 | |
| | 1 0 1 0 | 0 0 0 0 0 0 0 0 | |
| | 1 0 1 1 | 0 0 0 0 0 0 0 1 | |
| | 1 1 0 0 | 0 0 0 0 0 0 0 0 | |
| | 1 1 0 1 | 0 0 0 0 0 0 0 1 | |
| | 1 1 1 0 | 0 0 0 0 0 0 0 0 | |
| | 1 1 1 1 | 0 0 0 0 0 0 0 1 | |

METHOD AND APPARATUS FOR AUTOMATIC HIGH-SPEED BYPASS ROUTING IN A CELL MATRIX SELF-CONFIGURABLE HARDWARE SYSTEM

BACKGROUND OF THE INVENTION

The present invention relates to the field of cell-based parallel processing systems. In particular, it relates to high speed routing in a self-configurable system. More particularly, it relates to a system for automatic activation of high-speed bypass routing in a Cell Matrix self-configurable system.

Detailed background on the Cell Matrix can be found in the references, including U.S. Pat. No. 5,886,537. This invention does not directly involve the C-mode behavior of a cell. Only the D-mode operation is directly affected by the present invention.

Most reconfigurable hardware devices (FPGAs) consist of two sets of elements: one set which implements the logical circuits, and another which controls the routing among those logical circuits. Both sets of elements are configured in a fashion which is decided at compile time, i.e., before the device is actually configured. U.S. Pat. No. 5,457,410 is an example of this.

In a self-configurable system such as the Cell Matrix, both logical configuration and routing decisions may be made at run-time, rather than at compile time. Moreover, on a Cell Matrix, the elements which implement logical circuits and those which control routing are exactly the same. These elements, which are called cells, are indistinguishable except for their current configuration. At any time, a given cell may be operating as either a logic element, or as a wire connecting other cells together, or as both.

This fine-grained approach has a number of advantages over other reconfigurable devices, including greater flexibility, easier configuration, scalability of the architecture, and improved fault tolerance. Additionally, whereas other reconfigurable devices such as that disclosed in U.S. Pat. No. 6,292,022 include a fixed number of dedicated routing resources, a Cell Matrix has no dedicated resources. Therefore, a routing-intensive application may use many cells for routing, whereas a more centralized circuit may use most available resources for implementing logic instead of routing. This leads to potentially better resource utilization on a Cell Matrix vs. other reconfigurable devices with dedicated routing resources.

However, there is a performance penalty in using cells to connect other cells together. While cells operate in an unclocked fashion in D mode (in which they are processing inputs and producing outputs accordingly), there is still a non-zero propagation delay t associated with each cell, where t is the time from a change in a cell's inputs to the corresponding change in the cell's outputs. When a series of n cells are configured to act as a wire, i.e., with each cell passing information to a neighboring cell bucket-brigade fashion, there is a minimal propagation delay of n*t. For very large n, as is envisioned with future nano-scale Cell Matrices, this delay can become significant.

Existing FPGAs avoid this issue by using dedicated routing resources, which transfer information throughout the device with minimal delays. On a Cell Matrix, such resources do not exist, and their inclusion would complicate configuration, impair scalability, and reduce the system's tolerance to faults. However, for certain cases, it is possible to have the cells within the matrix autonomously detect their own usage as a wire, and automatically access high-speed connections which bypass the intervening cells, thereby reducing transmission time to 2*t, the propagation delay of two cells (one at each end). This allows the Cell Matrix to remain extremely homogeneous, scalable, and fault tolerant, while eliminating the extensive propagation delays which occur in a wire constructed from Cell Matrix cells such as those outlined in U.S. Pat. No. 6,222,381.

Additionally, with many methods for configuring programmable devices, such as described in U.S. Pat. No. 6,216,259 the configuration string must explicitly specify how routing resources are to be used, thereby complicating the generation of configuration strings. This is particularly troublesome for autonomous, self-configuring systems, since global knowledge may be required for utilization of hierarchical routing resources.

OBJECTS AND ADVANTAGES

Accordingly, several objects and advantages of the present invention are:

a) to augment a Cell Matrix cell to allow for high-speed transmission of information through a series of cells by bypassing each cell's normal input->output mechanism, instead using a direct bypass line;

b) to provide a mechanism which can utilize mechanical switches, allowing for the creation of direct connections between some of a cell's inputs and outputs, thereby further minimizing transmission time across a series of cells;

c) to provide a mechanism for automatically detecting, within each cell, opportunities for high-speed wiring, thereby allowing bypass wiring decisions to be made at run-time, and to be made locally without external intervention;

d) to provide a mechanism for disconnecting unneeded inputs from internal logic circuitry, thereby avoiding needless capacitive loads on such inputs;

e) to allow a Cell Matrix cell to operate correctly both before and after bypass circuitry has been activated;

f) to preserve the scalability of the Cell Matrix architecture by avoiding the addition of structures outside the individual cells;

g) to preserve the homogeneity of the Cell Matrix architecture by allowing all cells to remain identical to each other; and h) to preserve the fault tolerance of the Cell Matrix architecture by avoiding the addition of permanent, long wires which cross multi-cell regions of the matrix.

Further objects and advantages are to provide a system whose design is regular enough to allow easy manufacturing of larger systems from smaller ones. Still further objects and advantages will become apparent from a consideration of the ensuing description and drawings.

SUMMARY

Figures 1, 2:
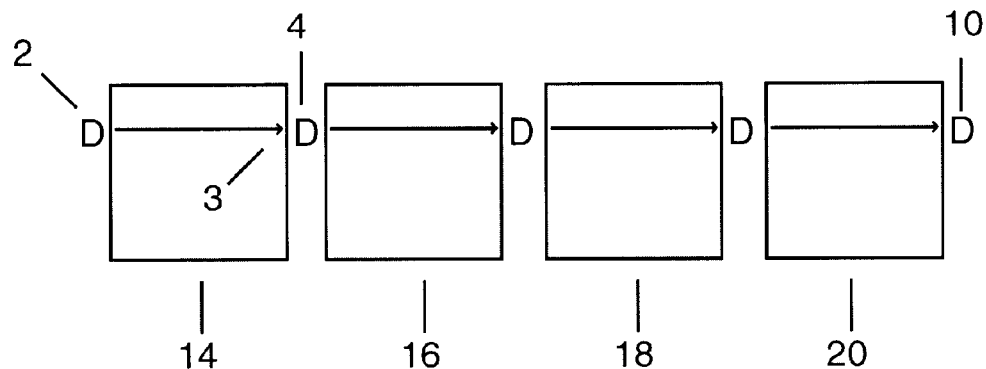
FIG. 1 illustrates four Cell Matrix cells configured to act as a multi-cell wire.
FIG. 2 illustrates the lookup table for a cell configured to act as part of a wire.

The present invention enhances the design of a Cell Matrix cell by allowing it to autonomously detect its usage as part of a multi-cell wire. When such usage is detected, the cell activates direct, high-speed connections between certain of its inputs and outputs, bypassing part of its internal circuitry. This perfectly preserves the functional behavior of the cell, while decreasing the response time of the cell's input->output mapping. When a series of such enhanced cells are all operating as part of a multi-cell wire, each cell's bypass connection is connected to a neighboring cell's bypass connection, in such a way that the entire set of cells collectively implements a single bypass line, thus decreasing the total propagation delay along the entire multi-cell wire. When the bypass circuitry is mechanical in nature, this bypass line becomes electrically equivalent to a single piece of metal, thereby reducing propagation delay to the same as a direct connection. Such a bypass line may also be used to pass non-digital signals: analog signals or high-voltage signals may thus be passed through the Cell Matrix without harm to the internal components. Unlike devices which require explicit configuration of high-speed routing resources, the enabling and disabling of these bypass lines is handled autonomously by each cell, thus there is no change in how the Cell Matrix is configured or used-the enhancement is transparent to the user. Finally, because each cell continually makes its own bypass decisions, without regard for anything except its own state, there is no increasing complexity or time penalty associated with larger matrices.

DESCRIPTION—FIRST EMBODIMENT

The present invention relates to the Cell Matrix self-configurable processing system. Such a system consists of a regular collection of "self-dual" processing elements called cells, as described is U.S. Pat. No. 5,886,537. The relevant features of such cells are as follows. First, each cell has a set of inputs called its C inputs, and another set of inputs called its D inputs. A cell also has corresponding sets of C and D outputs. In general the number of C inputs, D inputs, C output and D outputs are all the same, each being equal to the number of immediate neighbors associated with a cell. Each cell contains an internal lookup table, also called a truth table, organized as n rows by m columns, where n is 2^(number of D inputs), and m is (number of C outputs+ number of D outputs). Thus, the D inputs can be used to select a single row from the cell's lookup table, and the contents of that row specify the cell's C and D outputs. This is the normal mode of operation of a cell, which is called "D-mode" operation. A cell operates in D-mode precisely when all of its C inputs are 0.

There is an alternate mode of operation for a cell, called "C-mode." A cell is operating in C-mode when any of its C inputs are 1. C-mode is used to read and write a cell's internal lookup table. For the present discussion, the details of C-mode operation are irrelevant. The present invention operates only when a cell is in D-mode, i.e., all of the cell's C inputs are 0.

The present invention is largely independent of the particulars of the Cell Matrix implementation. For example, though four-sided cells will be used as examples throughout the specification, the present invention applied equally to cells with any number of sides, or in any interconnection topology. As another example, U.S. Pat. No. 5,886,537 discloses a Cell Matrix architecture which employs a shift register memory for a cell's internal lookup table, while U.S. Pat. No. 6,222,381 discloses a design which utilizes a non-shifting memory. The present invention operates independently of such details, and applies equally to both inventions.

FIG. 1 shows a collection of four four-sided cells inside a two-dimensional Cell Matrix. Throughout this description, we will focus on four-sided cells. However, the description easily generalizes to cells with more or fewer sides. Each cell is configured by loading bits into its internal lookup table (also called a truth table), which directs how the cell will map inputs to outputs. In FIG. 1, each cell has been configured to implement the function DW→DE, i.e., whatever data is supplied to cell 14's DW input 2 will be transferred to its DE output 3. Since cell 14's DE output 3 is directly connected to cell 16's DW input 4, whatever data is supplied to input 2 will appear on input 4, and will be subsequently transferred to output 6. As each cell 14, 16, 18 and 20 transfers its DW input to its DE output, the entire collection of cells acts to transfer data fom input 2 to output 10. In this sense, the collection of four cells is acting as a wire.

Each cell contains logic which examines its internal lookup table and its D inputs, and generates D outputs accordingly. This input-to-output mapping process, which occurs continually, may require several levels of digital logic, depending on the particular implementation of the Cell Matrix architecture. If a single cell has a propagation delay of t from its inputs to its outputs, then a collection of n cells acting as a wire has a propagation delay of at least n*t.

FIG. 2 shows the lookup table for cell 14. Columns 46 indicate what value should be sent to the cell's D and C outputs in response to each combination of inputs 44. In particular, column 40 indicates what value should be sent to the cell's DE output. As can be noted in FIG. 2, in each row of the lookup table, the DE output is set to the same value as DW input 42, regardless of the cell's other D input values. Thus, the cell effectively transfers data from its DW input to its DE output.

Figure 3:
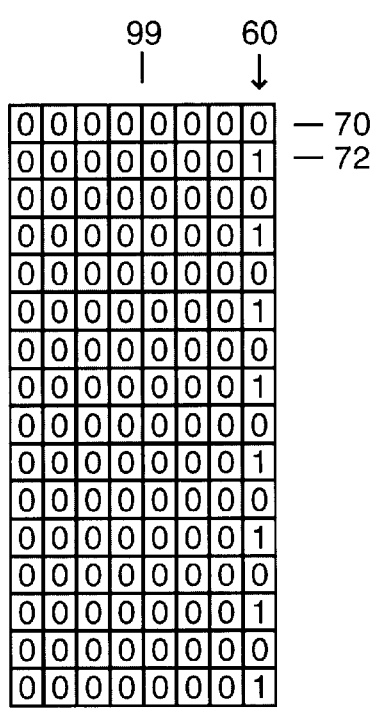
FIG. 3 illustrates an implementation of a cell's lookup table.

FIG. 3 shows a 128-bit memory which stores a cell's lookup table. In this figure, memory 99 is implement as 128 one-bit registers. By way of example, the values stored in each register correspond to the truth table shown in FIG. 2. Decoding logic is not shown in the figure. Column 60 corresponds to the cell's DE output, 40 in FIG. 2. Register 70 corresponds to lookup table bit 50 in FIG. 2, register 72 corresponds to lookup table bit 52 in FIG. 2, and so on. The particular implementation of the registers in FIG. 3 is irrelevant in what follows, provided the value stored in each register is continually available for reading. For example, a simple 16×8 array of D flip flops would suffice.

Figure 4:
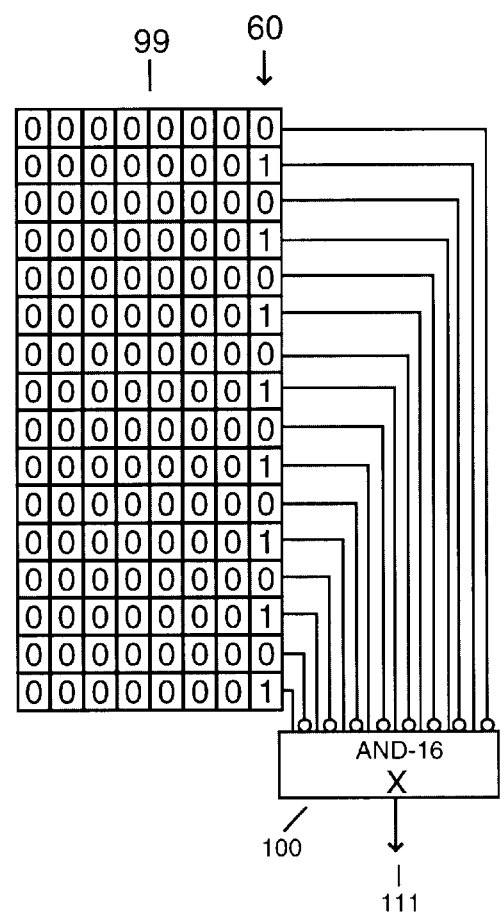
FIG. 4 illustrates a lookup table with additional circuitry for detecting a DW→WE mapping.

FIG. 4 shows the same 16×8 memory of FIG. 3, with additional logic which analyzes the contents of the registers in column 60. AND gate 100 has 8 true inputs and 8 inverted inputs. The contents of the registers in column 60 are fed to AND gate 100 in such a way that output 111 will be TRUE if and only if the registers in column 60 contain the values shown in FIG. 4. In other words, output 111 is 1 if and only if memory 99 corresponds to a lookup table containing the mapping DW→DE. Note that the contents of the other columns in memory 99 do not affect output 111. Using the logic shown in FIG. 4, a cell can thus autonomously detect that its lookup table is passing information unchanged from its DW input to its DE output. Note that the particular implementation of this 16-input AND gate is irrelevant. This could be instead implemented with a cascade of two-input AND gates, or with NOR gates, and so on. The logical function of recognizing the particular bit pattern is all that is important.

Figure 5:
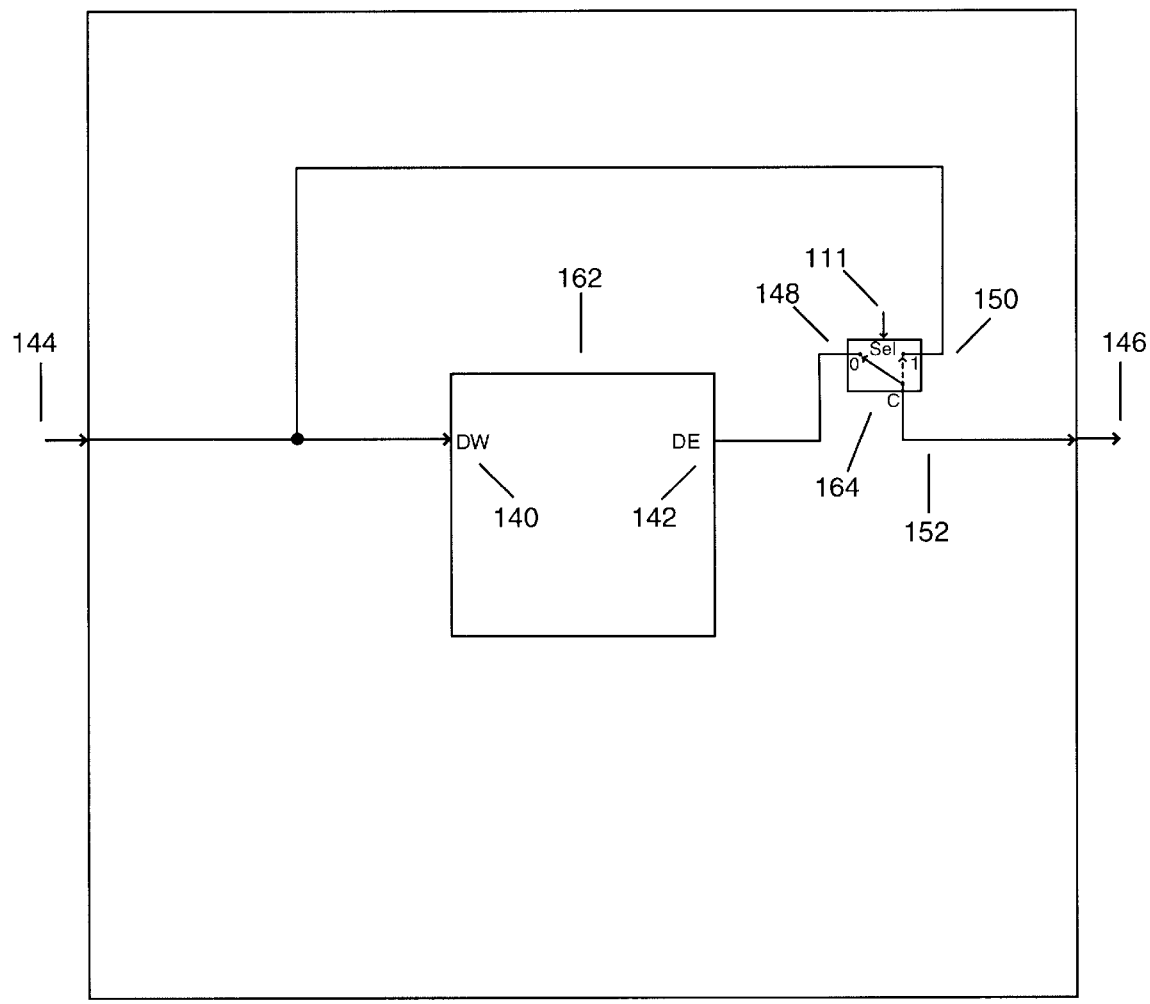
FIG. 5 illustrates an enhanced cell containing bypass detection and activation circuitry.

FIG. 5 shows an enhanced cell 160. This cell contains a circuit 162, which is a normal Cell Matrix cell containing bypass detection circuitry such as shown in FIG. 4. Collectively, 162 will be called an un-enhanced cell. Cell 160 is called an enhanced cell. It contains un-enhanced cell 162, as well as a relay circuit 164. 164 may be a mechanical relay, or may be implemented electrically with a set of pass transistors in the usual fashion. Other implementations of a relay function will also work. All that is important is the ability to select one of two outputs 148 and 150 to which a common line 152 will be connected. This connection is controlled by a select signal 111.

Cell 160's DW input arrives on line 144. Cell 160's DE output is sent on line 146. Input 140 and output 142 are cell 162's normal DW input and DE output, respectively.

152 is the relay's common line, which can be connected to either 148 or 150, depending on the value of control signal 111. If 111 is 0, then common 152 is connected to 148. If control signal 111 is 1, then common 152 is connected to 150.

Recall that control signal 111 indicates that cell 162's lookup table contains the mapping DW→DE. This, if the lookup table contains this mapping, relay 164 will connect input 144 directly to output 146. If, however, the lookup table does not contain the mapping DW→DE, then control signal 111 will be 0, and relay 164 will connect 162's output 142 to cell 160's DE output 146.

Thus, if cell 162's lookup table maps DW→DE, this bypass circuitry will directly connect DW input 144 to DE output 146. Otherwise, DE output 146 is driven by the usual cell logic which generates output 142. Note that regardless of the state of control signal 111, cell 162's DW input is always sent to input 140 of un-enhanced cell 162.

Enhanced cell 160 thus acts as a normal Cell Matrix cell, with the additional feature that, if its lookup table contains the mapping DW→DE, the cell will directly connect its DW input to its DE output. Thus, while the functional behavior of cell 160 is no different from that of an un-enhanced cell, the propagation delay of signal transmission from DW→DE is reduced via this direct connection, relative to the delay in an un-enhanced cell.

While the circuit of FIG. 5 works well in D-mode, it does not operate correctly during C-mode (configuration) operation. When a cell is being configured, its D outputs are set differently from when it is in D-mode. Thus, the circuit of FIG. 5 would potentially present the wrong outputs to DE output 146 while being configured.

Figure 6:
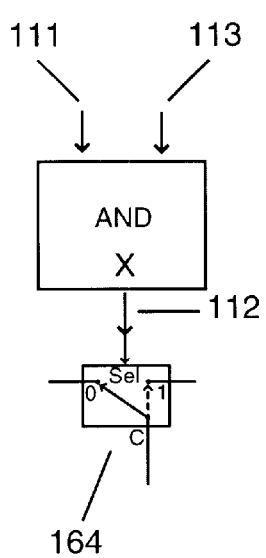
FIG. 6 illustrates a circuit for blocking bypass operation in a C-mode cell.

Therefore, for the circuit in FIG. 5 to work properly in C-mode, control signal 111 should be forced to 0 during C-mode operation. This can be done with one additional AND gate, as shown in FIG. 6. Control signal 111 is ANDed with D-mode signal 113, which is asserted if and only if the cell is currently in D-mode. Thus, relay 164 receives a control signal of 1 if and only if the cell's lookup table contains the mapping DW→DE and the cell is in D-mode. If the cell is in C-mode, relay circuit 164 acts as if the lookup table did not contain the mapping DW→DE, and the cell operates as an un-enhanced cell.

Figure 7:
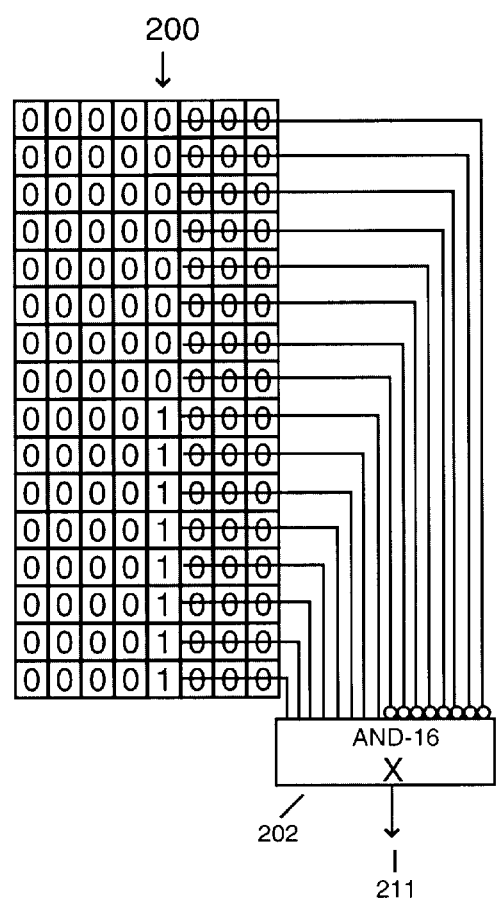
FIG. 7 illustrates a lookup table with additional circuitry for detecting a DS→DN mapping.

In what has been described so far, there is nothing special about the mapping DW→DE. That mapping has been chosen only as an example. In fact, the above enhancements can be applied just as well to, say, the mapping DS→DN, DN→DS or DE→DW. In each case, all that is required is that an AND gate (or other logic) compare the bit values stored in the appropriate column of memory 99, and report the presence or absence of the indicated mapping. Thus, as a further example, FIG. 7 shows a cell enhanced to detect the mapping DS→DN. Column 200 contains the output values for the DN output. Again, the registers are shown with the bit values which would correspond to the mapping DS→DN. AND gates 202 detect a bit pattern, in order from the top to the bottom, of 0000000011111111, which corresponds to the mapping DS→DN. Signal 211 is thus set to 1 if and only if the lookup table contains the mapping DS→DN.

Figure 8:
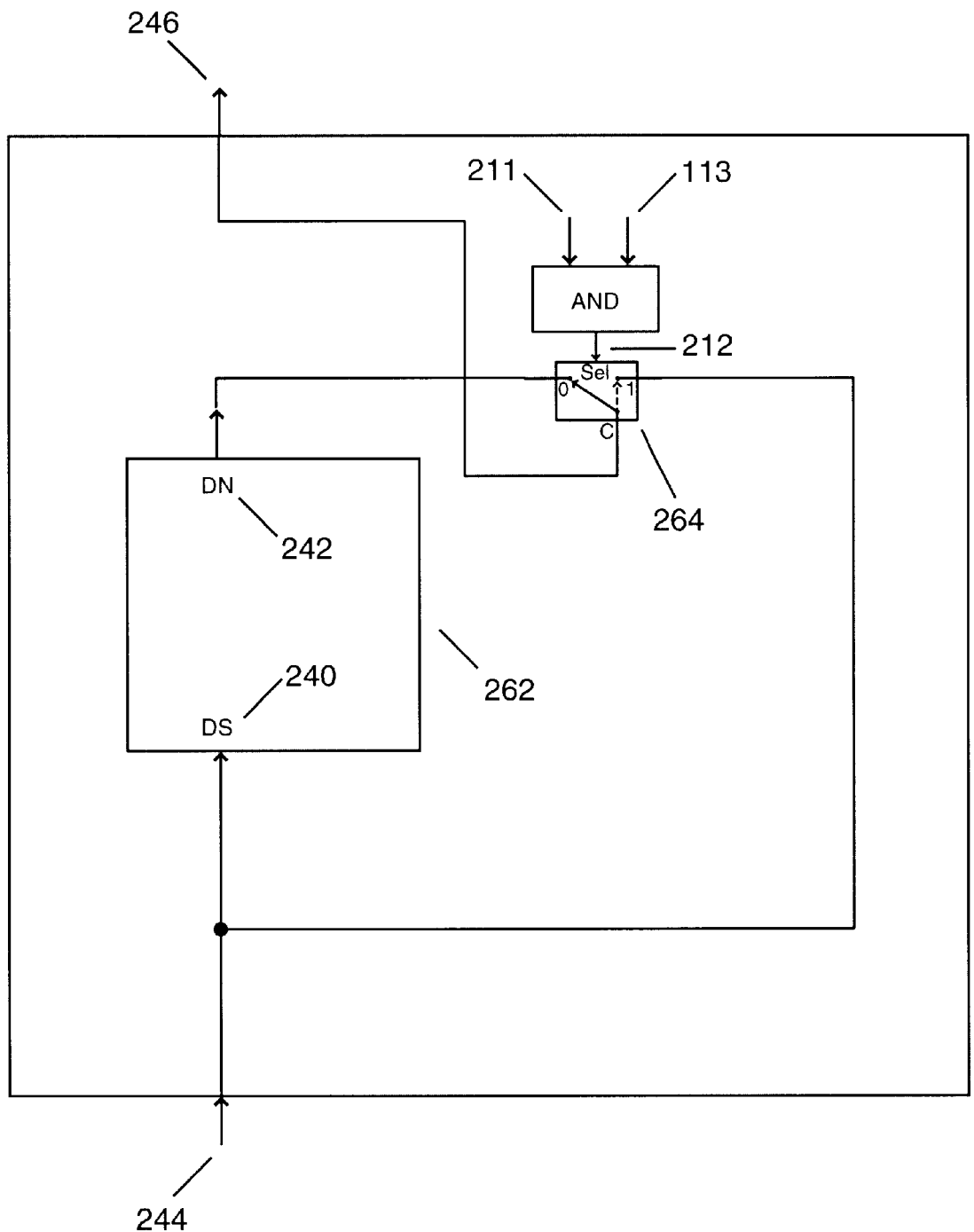
FIG. 8 illustrates an enhanced cell containing bypass detection and activation circuitry.

FIG. 8 shows an enhanced cell 260 containing an un-enhanced cell 262, with DS input 240 and DN output 242. Cell 260's DS input 244 is connected to input 240. Relay 264 causes cell 260's DN output 246 to be driven from either output 242, or directly from input 244, depending on the value of control signal 212. As before, control signal 212 is derived by ANDing D-mode signal 113 with signal 211. Since signal 211 indicates the presence of the mapping DS→DN, cell 260 thus connects its DS input 244 directly to its DN output 246 via relay 264 if and only if 260's lookup table contains the mapping DS→DN, and the cell is in D-mode. Otherwise, DN output 246 is driven by un-enhanced cell 262's normal logic.

In this fashion, bypass circuits can be implemented for any desired mapping. Moreover, because such bypass circuits operate independently of each other, it is completely straightforward to implement multiple bypass circuits within a single cell, by simple implementing the individual detection and bypass circuits within a single cell.

Figure 9:
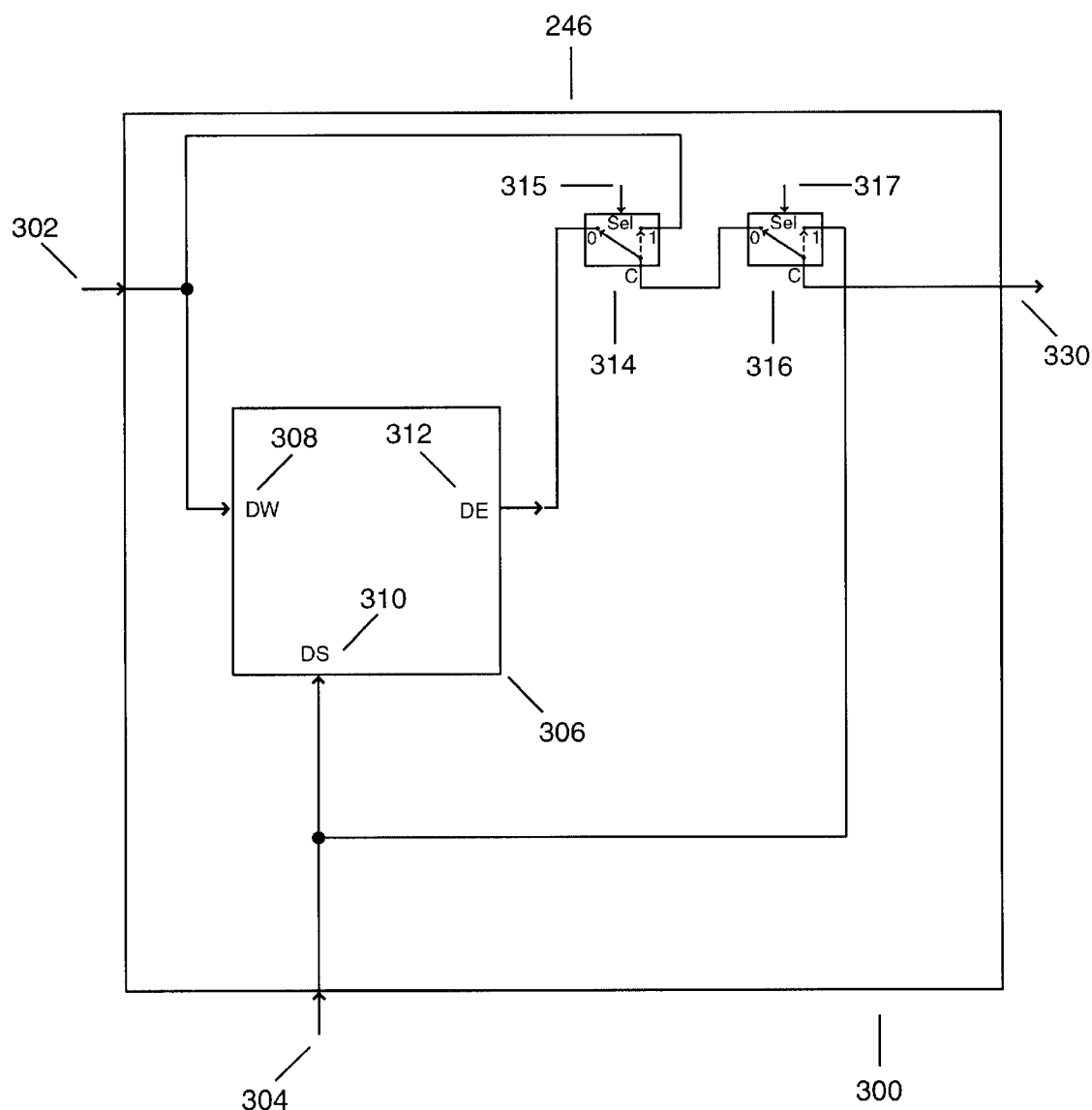
FIG. 9 illustrates an enhanced cell containing two bypass circuits with a common output.

It is also possible to implement bypass circuits for non-straight wires, i.e., for mappings such as DS→DE. Here a complication occurs, if there are multiple bypass circuits affecting the same output. For example, suppose we wish to enhance a cell to implement bypass circuitry for both the mapping DW→DE and DS→DE. FIG. 9 shows one way to achieve this.

Enhanced cell 300 contains an un-enhanced cell 306 as usual. 306's DW input 308 and DS input 310 are connected to cell 300's DW and DS inputs 302 and 304 respectively. Internal output 312 feeds a pair of relay circuits 314 and 316. Select signal 315 is fed by the W→E bypass signal, i.e., signal 315 will be 1 if and only if the cell's lookup table contains the equation DW→DE and the cell is in mode. Similarly, select signal 317 is fed by the S→E bypass signal. Signal 315 is generated by output 111 from FIG. 4, while signal 317 is generated by a circuit similar to that shown in FIG. 4, but with the inverted inputs of AND gate 100 adjusted based on the bit pattern to be detected. Relays 314 and 316 operate to drive output 330, based on the values of 315 and 317 as follows:

| 315 | 317 | Meaning | 330 |
|---|---|---|---|
| 0 | 0 | No bypasses | From output 312 |
| 1 | 0 | W → E | From input 302 |
| 0 | 1 | S → E | From input 304 |
| 1 | 1 | Impossible | |

Thus, if the cell is in D-mode and its lookup table contains the mapping DW→DE, then DE output 330 is directly connected to DW input 302. If the cell is in D-mode and its lookup table contains the mapping DS→DE, then DE output 330 is directly connected to DS input 304. If the cell is configured for neither DW→DE nor DS→DE, then output 330 is driven by the normal logic in un-enhanced cell 306. It is not possible for both signal 315 and signal 317 to be asserted, since each signal is asserted if and only if the DE output column of the cell's lookup table is set to a specific bit pattern.

In this fashion, it is thus possible to enhance the design of a Cell Matrix cell to detect and activate bypass circuitry for any desired set of lookup table mappings. In practice though, the direct mappings from one side to the opposite side are perhaps the most useful, since a long, multi-cell communication path is likely to contain primarily such straight mappings, as opposed to corners. Other combinations of bypass circuits can be implemented in a similar fashion. The subsequent design details are easily accessible by one skilled in the art.

It is also possible to implement bypass circuitry for functions more complex that just a wire. For example, the mapping (NOT DW)→DE could be detected, and a direct path containing an inverted could be built between the cell's DW input and its DE output. However, there is limited benefit to this type of enhancement. The main benefit is for long chains of consecutive cells, and such chains occur predominantly for implementing simple wires which pass information unchanged. One possible exception to this would be for efficiently bypassing complex cells which act like straight wires but have more complicated lookup tables. An example of such cells are those found is U.S. Pat. No. 6,297,667.

OPERATION—FIRST EMBODIMENT

The operation of an enhanced cell is identical to the operation of an un-enhanced cell. There is no change in the configuration or utilization of such a cell. Activation of the bypass circuitry is performed automatically by the cell itself. Other than the speedup in transmission from input to output, there is no outward effect of the bypass circuitry.

Note that the switching speed to the relay bypass circuit is largely irrelevant. Prior to the relay's switching, the cell will operate as a normal un-enhanced cell, using its lookup table and usual internal circuitry to drive its output. When the relay circuit eventually switches, outputs will be driven directly from inputs. There will be a change in the response time of the output, but functionally, the cell operates identically before and after the relay has switched. Thus, if a mechanical relay is used, it can be one with a low switching speed. Once the relay has engaged the bypass circuit, the input→output mapping is direct and fast.

DESCRIPTION AND OPERATION—SECOND EMBODIMENT

While the above embodiment effectively creates direct connections between inputs and outputs, the resulting connections are not as fast as they might be. In FIG. 5, even if relay 164 has created a direct connection between DW input 144 and DE output 146, input 144 is still connected to internal input 140. As such, in a typical VLSI implementation of a cell, if a circuit driving input 144 changes from 0 to 1, input capacitors inside cell 162 will need to be charged before the voltage at 144 raises to a logic 1 level. Likewise, changes from 1 to 0 will incur delays due to capacitances inside 162. As in the case of un-enhanced cells, this delay will compound by the number of cells in a multi-cell wire.

Figure 10:
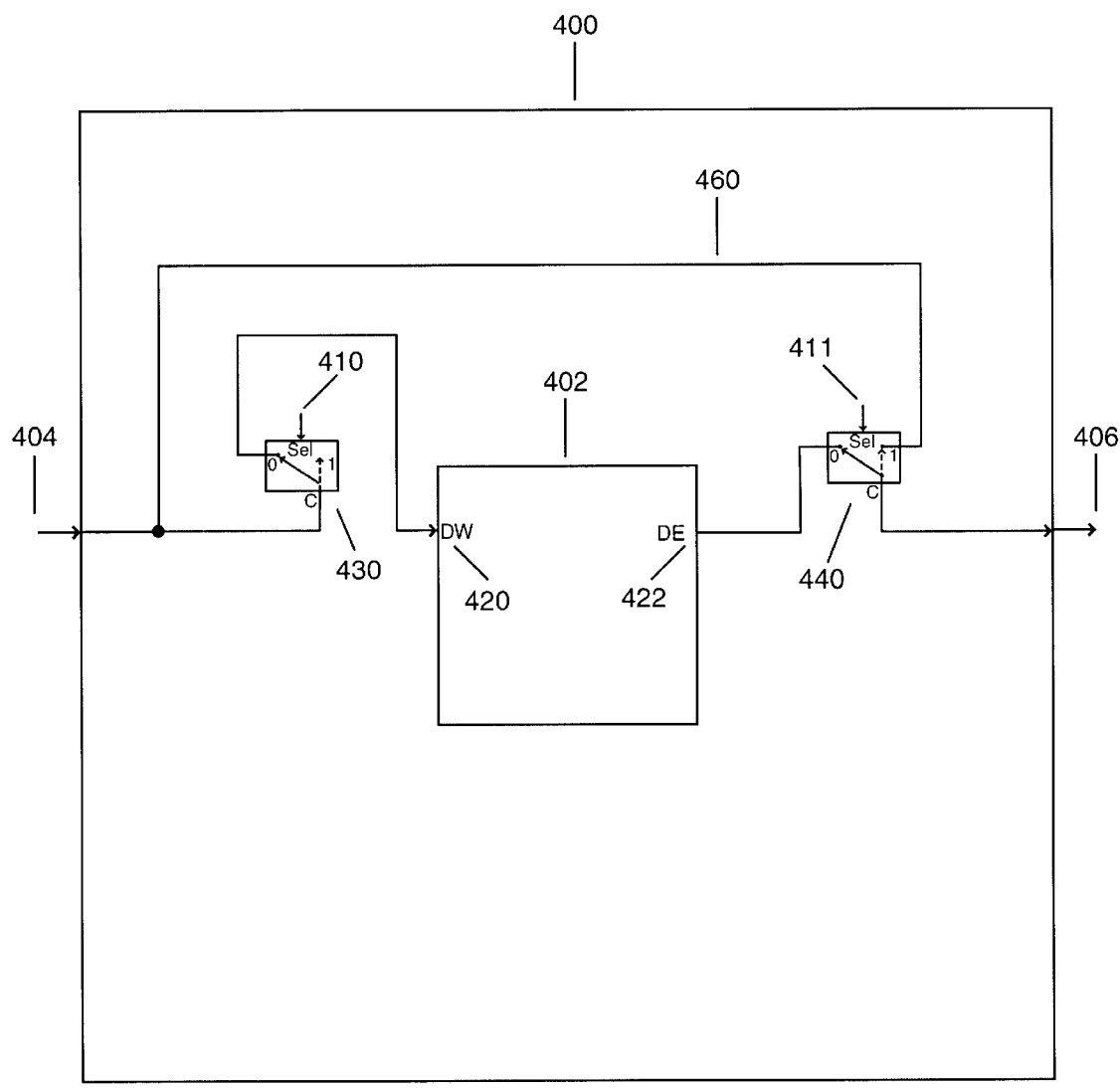
FIG. 10 illustrates a bypass circuit which disconnects unused inputs from internal logic.

FIG. 10 shows a second version of a bypass circuit which counters this effect. Enhanced cell 400 contains two relay circuits 430 and 440. Relay circuit 440 works as before, connecting output 406 to output 422 if select signal 411 is 0. If instead select signal 411 is 1, then output 406 is connected directly to external input 404. Signal 411 is 1 if and only if the cell's lookup table contains the mapping DW→DE and the cell is in D-mode. This part of the circuit thus operates the same as the circuit in FIG. 5. FIG. 10 differs from FIG. 5 by the addition of relay 430, which allows select signal 410 to connect or disconnect input 404 from input 420. Specifically, if select signal 410 is 0, then input 404 is connected to input 420. If select signal 410 is 1, then input 404 is disconnected from input 420.

Under normal conditions, select signals 410 and 411 are both 0. Thus, external input 404 feeds un-enhanced cell 402's input 420, and cell 402's output 422 is connected to external output 406. In this state, external lines 404 and 406 are thus each connected directly to cell 402. If, however, cell 402's truth table contains a mapping from DW→DE, and cell 402 is in D-mode, then select signal 411 will be set to 1, and output 406 will now come directly from input 404, thus bypassing un-enhanced cell 402's logic. Additionally, select signal 410 may be set to 1, thereby disconnecting input 404 from input 420. In this case, input 404 does not need to drive the internal logic of cell 402. Instead, it is only driving line 460, which is connected to output 406.

Whenever possible, if a bypass condition (DW→DE in the above example) has been detected, it is desirable to set select signal 410 to 1, to reduce the load on input 404 and thus increase the switching speed of a signal driving input 404. However, it is not always appropriate to set select signal 410 to 1, even when the truth table specifies a bypass condition such as DW→DE. There are a number of reasons for this complication.

Consider a cell configured with two equations: DW→DE and DW→DS. In such a configuration, if input 404 is disconnected from input 420, then un-enhanced cell 402's DW input will be floating, and cell 402 will likely not deliver the correct output to cell 400's DS output. Of course, if there is also bypass circuitry for detecting bent wires such as DW→DS, then cell 400's DS output will also be driven directly by input 404, and thus the circuit will operate correctly. In this case, however, if the cell's truth table was configured to perform the mappings DW→DE and !DW→DS, then no bypass would be possible for driving the DS output. There are at least three ways to handle this difficulty.

1. Avoid such configurations of cells. This puts the responsibility on the user to foresee such conditions and avoid them. This is the simplest and least desirable option.

2. Use a trick to avoid activating the bypass circuitry. For example, instead of configuring a cell as DW→DE, one can configure it as (DW.OR.DN)DE→. By supplying a 0 to the DN input, this equation is equivalent to DW→DE. However, the bypass detection circuitry will not see this as a configuration which can be bypassed, and thus select signals 410 and 411 will both be 0.

This allows a cell to implement the functions DW→DE and DW→DS by configuring the cell with (DW.OR.DN) →DE and DW→DS. Again, this puts the responsibility on the user to avoid unintended side effects of the bypass circuitry.

3. Add additional circuitry to the circuit of FIG. 10 to detect such conditions, and control select signal 410 accordingly. This option requires further explanation. In fact, there are a number of ways to determine when to connect or disconnect input 404 from input 420.

For the following description, it will be useful to define some notation relating to bit patterns in a cell's truth table. This notation corresponds to signals which can easily be generated inside a cell, by feeding bits from the cell's truth table memory through the indicated logic gates.

First, we introduce a shorthand for the bits in a cell's truth table. We will deal primarily with D outputs, ignoring the C output columns in the truth table unless otherwise stated. We do this because if a cell implements an equation such as DW→CE, that is a terminal operation, meaning that the cell to the East will not pass the incoming CE information. Rather, it will use the CE input to adjust its own mode (D or C).

In a 4-sided cell, for each truth table column, there are 16 possible combinations of four inputs: DS, DN, DE and DW. We will use the notation N(w,x,y,z) to represent the DN output for the conditions DS=w, DN=x, DE=y and DW=z. Similarly, S(w,x,y,z), W(w,x,y,z) and E(w,x,y,z) represent DS, DW and DE outputs respectively. Thus, in FIG. 2, E(0,0,0,0) corresponds to bit 50, E(0,0,0,1) corresponds to bit 52, and so on. Similarly, each possible bit X(w,x,y,z) corresponds to a single bit in a cell's truth table. We will also use the notation CN(w,x,y,z), CS(w,x,y,z), CE(w,x,y,z) and CW(w,x,y,z) for the C outputs.

Next, we define bypass conditions: W→E, E→W, N→S and S→N are binary variables indicating that a cell's truth table contains the indicated equations. Thus, W→E is 1 precisely when the cell is configured to pass data from its Western data input to its Eastern data output, independent of all other inputs. Additional variables are possible: W→N, W→S, E→N, E→S, N→W, N→E, S→W and S→E are binary variables representing corner bypasses. If corner bypasses have not been implemented, these variables may be treated as FALSE.

Each of these bypass variables is a simple Boolean combination of truth table bits, as indicated below:

| BYPASS | EQUATION |
|---|---|
| W → E | !E(0,0,0,0) & !E(0,0,1,0) & !E(0,0,1,0) & !E(0,1,1,0) & !E(1,0,0,0) & !E(1,0,1,0) & !E(1,0,1,0) & !E(1,1,1,0) & E(0,0,0,1) & E(0,0,1,1) & E(0,0,1,1) & E(0,1,1,1) & E(1,0,0,1) & E(1,0,1,1) & E(1,0,1,1) & E(1,1,1,1) | where "&" is a logical AND, "+" is a logical OR (used later), and "!" is a logical NOT.

This equation is a straightforward logic circuit, and in fact corresponds to output 111 in FIG. 4. It represents the combination of truth table bits corresponding precisely to the equation DW→DE.

This and other similar equations may be written more succinctly by using a dash ("-")as a "don't care" indicator. Thus, the above equation may be re-written as:

!E(-,-,-,0)& E(-,-,-,1)

which means the DE output must be 0 whenever DWin=0, and the DE output must be 1 whenever DWin=1. Using this shorthand, we can write the other bypass equations as follows:

| BYPASS | EQUATION |
|---|---|
| W → S | !S(—,—,—,0) & S(—,—,—,1) |
| W → N | !N(—,—,—,0) & N(—,—,—,1) |
| E → W | !W(—,—,0,—) & W(—,—,1,—) |
| E → S | !S(—,—,0,—) & S(—,—,1,—) |
| E → N | !N(—,—,0,—) & N(—,—,1,—) |
| N → S | !S(—,0,—,—) & S(—,1,—,—) |
| N → W | !W(—,0,—,—) & W(—,1,—,—) |
| N → E | !E(—,0,—,—) & E(—,1,—,—) |
| S → N | !N(0,—,—,—) & N(1,—,—,—) |
| S → W | !W(0,—,—,—) & W(1,—,—,—) |
| S → E | !E(0,—,—,—) & E(1,—,—,—) |

We next define a set of binary variables to indicate which outputs are not "in use," meaning they contain only zero entries. We will define the variable NZ to mean the North (data) output is always Zero. NZ may be computed as NZ=!N(0,0,0,0) & !N(0,0,0,1) & !N(0,0,1,0) & !N(0,0,1,1) & !N(0,1,0,0) & !N(0,1,0,1) & !N(0,1,1,0) & !N(0,1,1,1) & !N(1,0,0,0) & !N(1,0,0,1) & !N(1,0,1,0) & !N(1,0,1,1) & !N(1,1,0,0) & !N(1,1,0,1) & !N(1,1,1,0) & !N(1,1,1,1) SZ, WZ and EZ are defined similarly. Again, circuits to generate these binary signals are completely straightforward to design. We also define these variables for the C outputs: CNZ, CSZ, CWZ and CEZ indicate when the CN, CS, CW and CE outputs, respectively, are always 0.

Figure 11:
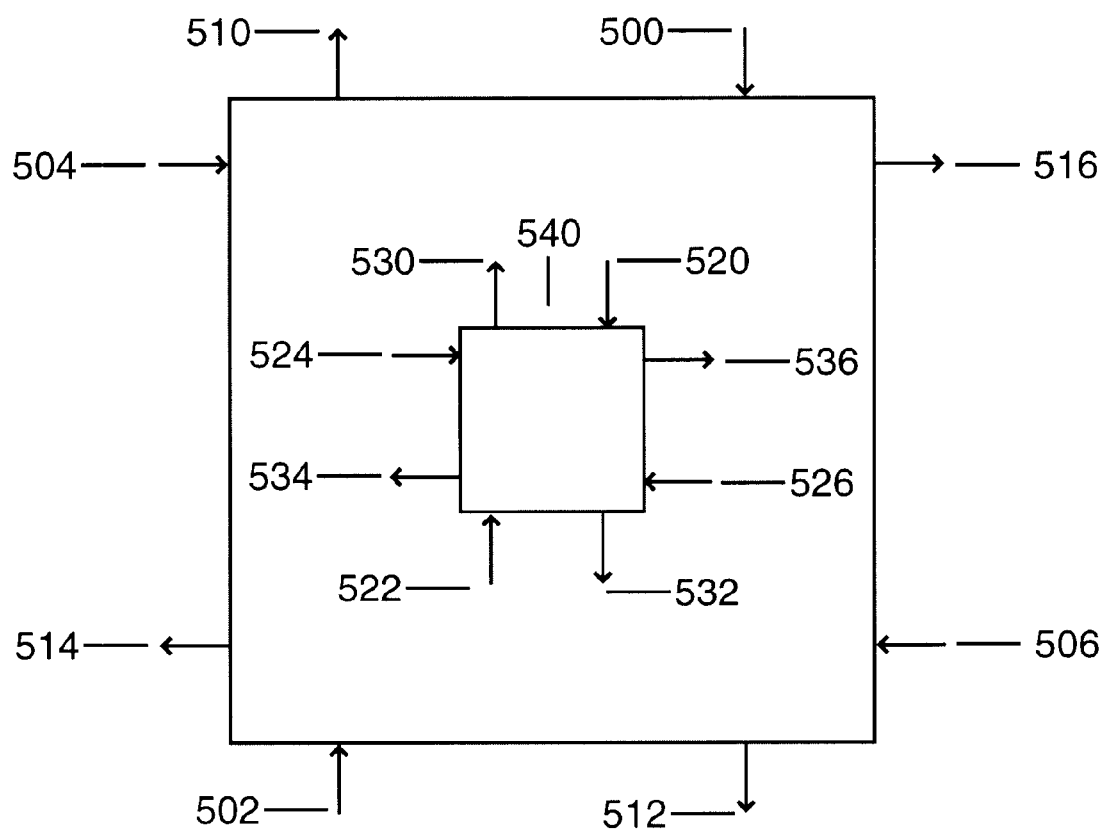
FIG. 11 illustrates an enhanced cell containing an un-enhanced cell.

We may now return to a discussion of how to determine when to connect or disconnect an input once a bypass condition has been detected. For completeness, we will work with an enhanced cell which contains circuitry for bypassing all straight and bent wires. FIG. 11 shows such an enhanced cell, containing an internal un-enhanced cell 540. 500, 502, 504 and 506 represent the N, S, W and E inputs, respectively, to the enhanced cell. 510, 512, 514 and 516 are the corresponding outputs of the enhanced call. 520, 522, 524 and 526 are the inputs to internal un-enhanced cell 540, while 530, 532, 534 and 536 are un-enhanced cell 540's outputs. Not shown in FIG. 11 is the logic shown, for example, in FIG. 4, for analyzing un-enhanced cell 540's truth table to generate the signals described above.

Figure 12:
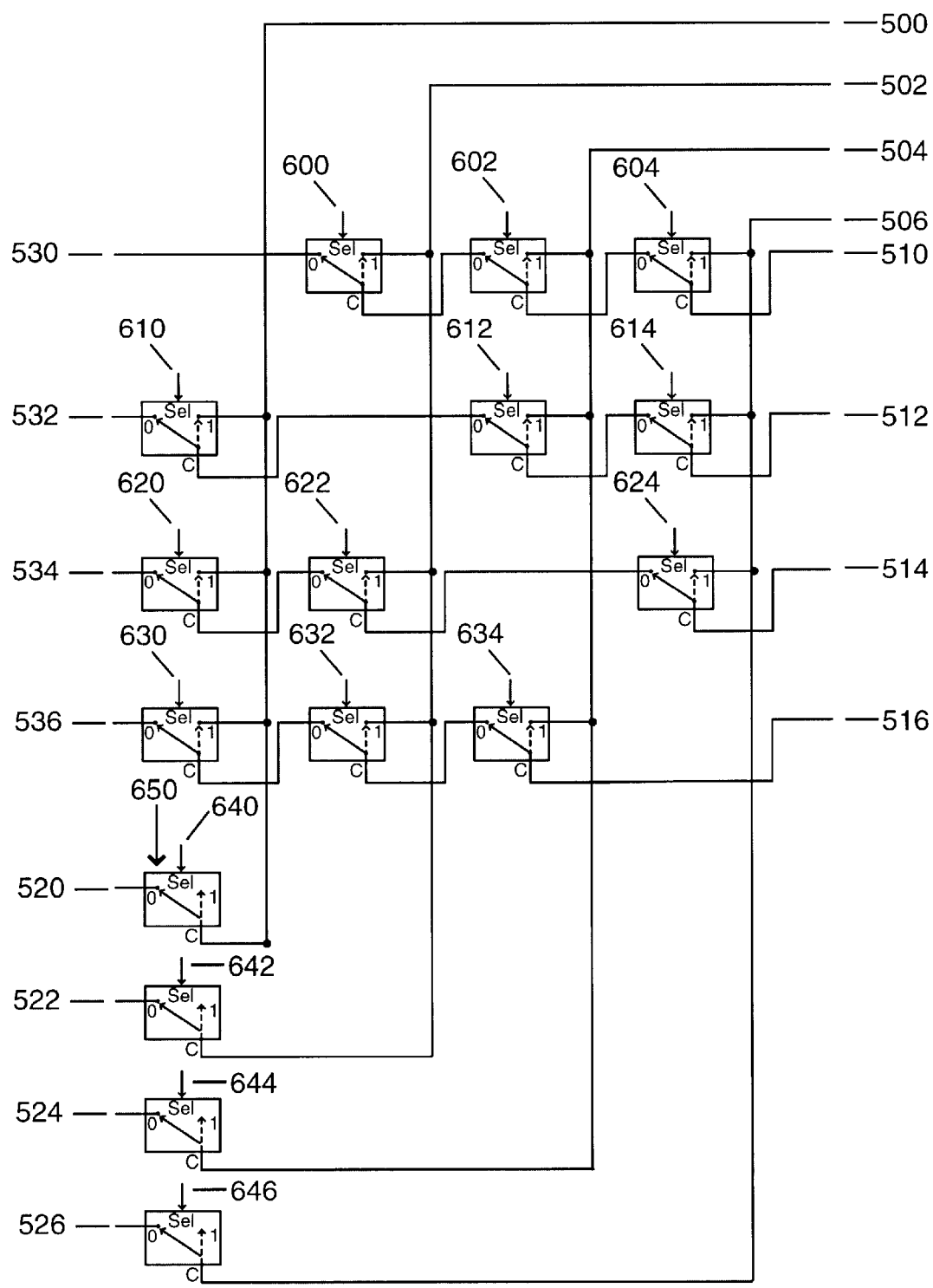
FIG. 12 illustrates a full set of bypass circuits for the enhanced cell of FIG. 11.

FIG. 12 shows the detailed bypass circuitry needed to implement this enhanced cell. The circuitry comprises a number of relay circuits, similar to relay 164 in FIG. 5. However, relays 650 may be of a simpler design, as their select lines only control the connection (Sel=0) or disconnection (Sel=1) of a common line from one input. In other words, relays 650 are SPST switches, while those such as 164 are SPDT.

Select signal 600 is driven by the S→N bypass signal, described above. 602 is driven by W→N, and 604 is driven by E→N. At most, one of these three signals will be TRUE. If any of them is TRUE, the corresponding input is connected directly to the appropriate output. For example, if W→N is TRUE, then select signal 602 will combine with the FALSE select signal 604 to connect input 504 to output 510. As can be seen in FIG. 11, such a connection corresponds to transferring data from the DW input to the DN output of the enhanced cell.

Similarly, each select signal is driven by a different bypass condition. The following table summarizes the mapping:

| Select Signal | Bypass which Drives It |
|---|---|
| 600 | S → N |
| 602 | W → N |
| 604 | E → N |
| 610 | N → S |
| 612 | W → S |
| 614 | E → S |
| 620 | N → W |
| 622 | S → W |
| 624 | E → W |
| 630 | N → E |
| 632 | S → E |
| 634 | W → E |

Relays 650 are used to disconnect external inputs 500, 502, 504 and 506 from internal un-enhanced cell 540's inputs 520, 522, 524 and 526, respectively. There are a number of strategies for controlling the select signals of these input disconnect relays.

The simplest approach to controlling the input disconnect relays 650 is to only disconnect input 520, 522, 524 or 526 if a corresponding bypass condition has been detected, and the cell is in D-mode, and only a single column in cell 540's configuration memory contains any ones. When these conditions are all true, then cell 540 must be implementing a single mapping, and thus it is guaranteed safe to disconnect input 520 from input 500, input 522 from input 502, input 524 from input 504, and input 526 from input 506. Such a scheme is simple to implement: For example (assuming straight and bent bypasses are available), DW input disconnect signal 644 is just: (DW→DE+DW→DN+DW→DS) & (D-mode) & (Sum(NZ,SZ,WZ,EZ, CNZ, CSZ, CWZ, CEZ)=7) (if only a subset of bypasses are implemented, just treat the unimplemented ones as 0). This equation is true precisely when (a) There exists some bypass condition from the DW input; (b) the cell is in D-mode; and (c) seven output columns of the truth table contain only zeros (the remaining column will necessarily be non-zero, since there is a bypass condition in the truth table). Thus, the above equation may be used to feed input disconnect signal 644. Disconnecting of the DE, DS and DN inputs may be controlled using similar equations to feed disconnect signal 646, 642 and 640, respectively.

While simple to implement, this strategy has the disadvantage of sometimes introducing unnecessary delays into the operation of a set of cells. For example, consider a cell whose truth table contains only the equations DW→DE and DW→DS. If bypass circuits are available for both DW→DE and DW→DS, then there is no need to feed input 504 into un-enhanced cell 520. However, the above strategy would nonetheless set input disconnect signal 644 to 0, thus connecting input 504 to input 524, thereby placing an unnecessary load on input 504.

A slightly more complex strategy is to allow more than one column of the cell's truth table to have non-zero entries, but to require that all such columns correspond to outputs which are being bypassed. This requires more logic than the above implementation, but has the advantage of allowing long communication paths with taps coming off them, without introducing needless delays at the taps. For example, a collection of cells each configured to implement DW→DE could have a cell in the middle also implement DW→DS, thus making the signal available to other logic or routing. This strategy would still allow the DW→DE /DW→DS cell to use bypass logic.

To implement this strategy, the disconnect signal 644 for disconnecting the West input would be the usual test D-Mode & (W→E+W→S+W→E)

ANDed with an additional signal:

AllowBypass = (NZ + DW → DN + DE → DN + DS → DN) &
(SZ + DW → DS + DE → DS + DN → DS) &
(WZ + DE → DW + DS → DW + DN → DW) &
(EZ + DW → DE + DN → DE + DS → DE) &
CNZ & CSZ & CWZ & CEZ Similarly, the AllowBypass signal is ANDed with the usual tests for disconnecting the DE, DN and DS inputs. The logic here is simply to not allow ANY input disconnects unless all non-zero truth table columns correspond to bypasses. In the above example, is a cell is configured to only implement the equations DW→DE and DW→DS, the AllowBypass signal will be TRUE, bypass circuitry will route the DW input directly to the DE and DS outputs, and DW input 504 will be disconnected from internal un-enhanced cell 540's DW input 524. This is thus an improvement over the previous strategy. However, it is still less than perfect. For example, if a cell implements the equations DW→DE and !DN→DS, there is no reason DW input 504 can not be disconnect from un-enhanced cell 520's DW input 524. However, because the AllowBypass signal will be FALSE, select signal 644 will be 0, and input 504 will be needlessly fed into input 520. The resulting operation will still generate the correct results, but with needless delay on state changes of input 504.

The perfect implementation of input disconnect logic is to allow an input to be disconnected its value does not affect any non-bypassed output. For example, the logic for driving disconnect signal 646 to disconnect DE input 506 from input 526 would be:

(W → N + S → N + E → N + (
(N(0,0,0,0) = N(0,0,0,1)) & (N(0,0,1,0) = N(0,0,1,1)) & (N(0,1,0,0) = N(0,1,0,1)) & (N(0,1,1,0) = N(0,1,1,1)) &
(N(1,0,0,0) = N(1,0,0,1)) & (N(1,0,1,0) = N(1,0,1,1)) & (N(1,1,0,0) = N(1,1,0,1)) & (N(1,1,1,0) = N(1,1,1,1)))) &
(W → S + E → S + N → S + (
(S(0,0,0,0) = S(0,0,0,1)) & (S(0,0,1,0) = S(0,0,1,1)) & (S(0,1,0,0) = S(0,1,0,1)) & (S(0,1,1,0) = S(0,1,1,1)) &
(S(1,0,0,0) = S(1,0,0,1)) & (S(1,0,1,0) = S(1,0,1,1)) & (S(1,1,0,0) = S(1,1,0,1)) & (S(1,1,1,0) = S(1,1,1,1)))) &
(E → W + N → W + S → W + (
(W(0,0,0,0) = W(0,0,0,1)) & (W(0,0,1,0) = W(0,0,1,1)) & (W(0,1,0,0) = W(0,1,0,1)) & (W(0,1,1,0) = W(0,1,1,1)) &
(W(1,0,0,0) = W(1,0,0,1)) & (W(1,0,1,0) = W(1,0,1,1)) & (W(1,1,0,0) = W(1,1,0,1)) & (W(1,1,1,0) = W(1,1,1,1)))) &
(W → E + N → E + S → E + (
(E(0,0,0,0) = E(0,0,0,1)) & (E(0,0,1,0) = E(0,0,1,1)) & (E(0,1,0,0) = E(0,1,0,1)) & (E(0,1,1,0) = E(0,1,1,1)) &
(E(1,0,0,0) = E(1,0,0,1)) & (E(1,0,1,0) = E(1,0,1,1)) & (E(1,1,0,0) = E(1,1,0,1)) & (E(1,1,1,0) = E(1,1,1,1)))) &
(CN(0,0,0,0) = CN(0,0,0,1)) & (CN(0,0,1,0) = CN(0,0,1,1)) &
(CN(0,1,0,0) = CN(0,1,0,1)) & (CN(0,1,1,0) = CN(0,1,1,1)) &
(CN(1,0,0,0) = CN(1,0,0,1)) & (CN(1,0,1,0) = CN(1,0,1,1)) &
(CN(1,1,0,0) = CN(1,1,0,1)) & (CN(1,1,1,0) = CN(1,1,1,1)) &
(CS(0,0,0,0) = CS(0,0,0,1)) & (CS(0,0,1,0) = CS(0,0,1,1)) &
(CS(0,1,0,0) = CS(0,1,0,1)) & (CS(0,1,1,0) = CS(0,1,1,1)) &
(CS(1,0,0,0) = CS(1,0,0,1)) & (CS(1,0,1,0) = CS(1,0,1,1)) &
(CS(1,1,0,0) = CS(1,1,0,1)) & (CS(1,1,1,0) = CS(1,1,1,1)) &
(CW(0,0,0,0) = CW(0,0,0,1)) & (CW(0,0,1,0) = CW(0,0,1,1)) &
(CW(0,1,0,0) = CW(0,1,0,1)) & (CW(0,1,1,0) = CW(0,1,1,1)) &
(CW(1,0,0,0) = CW(1,0,0,1)) & (CW(1,0,1,0) = CW(1,0,1,1)) &
(CW(1,1,0,0) = CW(1,1,0,1)) & (CW(1,1,1,0) = CW(1,1,1,1)) &
(CE(0,0,0,0) = CE(0,0,0,1)) & (CE(0,0,1,0) = CE(0,0,1,1)) &
(CE(0,1,0,0) = CE(0,1,0,1)) & (CE(0,1,1,0) = CE(0,1,1,1)) &
(CE(1,0,0,0) = CE(1,0,0,1)) & (CE(1,0,1,0) = CE(1,0,1,1)) &
(CE(1,1,0,0) = CE(1,1,0,1)) & (CE(1,1,1,0) = CE(1,1,1,1))

where "=" is a binary equivalence, i.e., XNOR. This complex equation determines whether or not any non-bypassed outputs depend on the DE input, by simply comparing output values when the DE input is 1 and 0. Though it requires a huge amount of logic, it is entirely straightforward to implement. When this equation evaluates to TRUE, it is safe to disconnect DE input 506 from un-enhanced input 526. The logic for controlling the disconnect of the DW, DN and DS inputs is similar, with the equality tests comparing output values when the given input is 1 and 0. For example, as shown above, the first comparison for testing for DE disconnect is N(0,0,0,0)=N(0,0,0,1), i.e., the comparison is made between two values of the last variable, which corresponds to East. Similarly, the first comparison for testing for DN disconnect would be N(0,0,0,0)=N(1,0,0,0). For DS, it would be N(0,0,0,0)=N(0,1,0,0), and for DW, it would be N(0,0,0,0)=N(0,0,1,0).

While the amount of gates needed to implement the above equation in a traditional silicon circuit may be huge, any operation which computes the value of the above equation will suffice, i.e., it need not be implemented with the ANDs, ORs and XNORs as described above. Functional equivalence is all that matters.

A final note should be made on the timing of the bypass circuits. In a case where an input will be fed directly to an output using a bypass line, and the input will be disconnected from other internal logic, it may be desirable to have the output be connected to the bypass line before the input is disconnected from the internal logic (actually, the output can be connected slightly after, as long as the disconnect of the input has not trickled through the internal circuitry). This can minimize the impact of switching delays associated with slow mechanical relays.

Likewise, in leaving a bypass condition, the input should be re-connected to the internal logic before the output is disconnected from the bypass circuit. Thus, for example, in the case of a W→E bypass, bypass signal 634 should raise before input disconnect signal 644 raises, and input disconnect signal 644 should drop before bypass signal 634 drops. This can be achieved by standard engineering techniques for introducing edge-sensitive delays.

SUMMARY, RAMIFICATIONS, AND SCOPE

From the above descriptions, it can be seen that the disclosed bypass detection and implementation circuitry does not change the functional behavior of a Cell Matrix cell, but can significantly increase the speed with which.information is moved from a cell's inputs to its outputs. This speedup has a profound effect on the transmission speed across a long, multi-cell wire. Moreover, the disclosed enhancements do not impair the scalability, homogeneity or fault tolerance of the Cell Matrix architecture, since these enhancements are made within each cell, and are independent of other neighboring cells. Because cells decide for themselves when to implement bypass routing, there is no change in the configuration procedures for a Cell Matrix, nor is there an increase in configuration complexity or time. Cell Matrix cells, thusly enhanced by the disclosed bypass circuitry, achieve high-speed routing similar to that found in other reconfigurable devices, but without the penalties of reduced scalability, more complex manufacturing, and more complex configuration.

While the above descriptions contain many specificities, these should not be construed as limitations on the scope of the invention, but rather as examplifications of two preferred embodiments thereof. Many other variations are possible. For example, many implementations of the relay circuits are possible, including a variety of MEMS mechanical relays. Implementation details of the logic which detects certain mappings inside a cell's lookup table can vary widely, using different types of logic gates, etc. Many of the above descriptions have used the mapping DW→DE as an example. However, the choice of which mappings should be bypassed can also vary, depending on the envisioned application, expected configurations, and available resources. Furthermore, some of the descriptions discuss only straight wires (e.g., DW→DE), while others include bent wires (e.g., DW→DS). However, as already noted in the descriptions, the general behavior of the bypass circuitry is independent of the particular equations which are chosen as bypass candidates.

Furthermore, the choice of technology for implementing the bypass circuitry, as well as for implementing the Cell Matrix itself, is irrelevant, and need not even be electrical in nature. The functional behavior of the disclosed apparatus is what is relevant. Additionally, there are many possible dimensionalities and interconnection topologies of cells within a Cell Matrix, as disclosed in U.S. Pat. No. 5,886,537, and the bypass apparatus disclosed herein applies equally well to all these variations.

Accordingly, the scope of the invention should be determined not by the embodiments illustrated, but by the appended claims and their legal equivalents.

What is claimed is:

1. A programmable logic device, operating in one of two modes, one of said modes being called C mode, the other of said modes being called D mode, said device comprising:
   (a) a plurality of input channels,
   (b) a mode selection means of choosing C or D mode based on a subset of said plurality of input channels,
   (c) a plurality of output channels,
   (d) an internal storage memory, viewed conceptually as a lookup table organized in rows and columns, the number of said rows being 2 raised to the power of the number of gold input channels/2, the number of said columns being the same as the number of said output channels,
   (e) a writing means of modifying the contents of said storage memory based on said mode and a subset of said plurality of input channels,
   (f) a reading means of selecting some set of bits from said storage memory based on said mode and on the values of a subset of said plurality of input channels,
   (g) a detecting means of detecting certain bit patterns in said storage memory,
   (h) a setting means of setting a first subset of said output channels based on said mode, on said set of bits, and on said bit patterns, and
   (i) a setting means of, when said mode is D mode, setting a second subset of said output channels, disjoint from said first subset of output channels, based on a subset of said plurality of input channels, and on said bit patterns,
   whereby said programmable logic device can set certain output channels by using said storage memory as a lookup table, and can set certain other output channels by bypassing said storage memory and directly using certain inputs to set said other output channel values.

2. The programmable logic device of claim 1, wherein said bit patterns correspond to one or more logic equations, each of which pass data, unchanged, from an input to an output.

3. The programmable logic device of claim 2, wherein said means of setting a first subset of said output channels comprises setting said outputs to the values of said selected bits from said storage device, and where said means of setting a second subset of said output channels comprises, for each of said logic equations, a switching means for connecting the output channel corresponding to said output specified by said logic equation to the input channel corresponding to said input specified by said logic equation when said bit pattern corresponding to said logic equation has been detected, and where said switching means will otherwise set said output channel to one of said values of said selected bits, whereby certain outputs may be generated using the device's internal lookup table, while other outputs are directly connected to certain inputs.

4. The programmable logic device of claim 3, wherein said switching means comprises a pair of pass transistors, said pass transistors having their outputs connected together, said connection forming a common pole, said transistors having their gates driven by complimentary select signals, said transistors further each having their input available as a pole, whereby said pair of pass transistors thereby acts as a single pole double throw switch, electronically controllable by said select signals.

5. The programmable logic device of claim 3, wherein said switching means comprises a mechanical relay, acting as a single pole double throw switch.

6. The programmable logic device of claim 1, wherein said bit patterns correspond to all possible logic equations for passing data, unchanged, from an input to an output.

7. A programmable logic device, operating in one of two modes, one of said modes being called C mode, the other of said modes being called D mode, said device comprising:
   (a) a plurality of input channels,
   (b) a mode selection means of choosing C or D mode based on a subset of said plurality of input channels,
   (c) a plurality of output channels,
   (d) an internal storage memory, viewed conceptually as a lookup table organized in rows and columns, the number of said rows being 2 raised to the power of the number of said input channels/2, the number of said columns being the same as the number of said output channels,
   (e) a writing means of modifying the contents of said storage memory based on said mode and a subset of said plurality of input channels,
   (f) a reading means of selecting some set of bits from said storage memory based on said mode and on the values of a set of internal inputs,
   (g) an input disconnect means of, when said mode is D mode, selectively connecting or disconnecting each input of a subset of said plurality of input channels from said means of selecting some set of bits, based on a plurality of input disconnect signals, corresponding one-to-one with said subset of said plurality of input channels,
   (h) a detecting means of detecting certain bit patterns in said storage memory,
   (i) a means of detecting certain lookup table properties of said lookup table,
   (j) a setting means of setting a first subset of said output channels based on said mode, on said set of bits, on said lookup table properties, and on said bit patterns, and
   (k) a setting means of, when said mode is D mode, setting a second subset of said output channels, disjoint from said first subset of output channels, based on said mode, on a subset of said plurality of input channels, on said lookup table properties, and on said bit patterns, whereby said programmable logic device can set certain output channels by using said storage memory as a lookup table, and can set certain other output channels by bypassing said storage memory and directly using certain inputs to set said other output channel values, and may further cause certain inputs to be disconnected from said internal storage memory lookup logic.

8. The programmable logic device of claim 7, wherein said bit patterns correspond to one or more logic equations, each of which pass data, unchanged, from an input to an output.

9. The programmable logic device of claim 7, wherein said bit patterns correspond to all possible logic equations for passing data, unchanged, from an input to an output.

10. The programmable logic device of claim 8, wherein said means of setting a first subset of said output channels comprises setting said outputs to the values of said selected bits from said storage device, and where said means of setting a second subset of said output channels comprises, for each of said logic equations, a bypass switching means for connecting the output channel corresponding to said output specified by said logic equation to the input channel corresponding to said input specified by said logic equation when said bit pattern corresponding to said logic equation has been detected, this state of said switching means being called "on," and where said switching means will otherwise set said output channel to one of said values of said selected bits, this state of said switching means being called "off," whereby certain outputs may be generated using the device's internal lookup table, while other outputs are directly connected to certain inputs.

11. The programmable logic device of claim 10, wherein said switching means comprises a pair of pass transistors, said pass transistors having their outputs connected together, said connection forming a common pole, said transistors having their gates driven by complimentary select signals, said transistors further each having their input available as a pole, whereby said pair of pass transistors thereby acts as a single pole double throw switch, electronically controllable by said select signals.

12. The programmable logic device of claim 10, wherein said switching means comprises a mechanical relay, acting as a single pole double throw switch.

13. The programmable logic device of claim 10, wherein said input disconnect means comprises a pass transistor.

14. The programmable logic device of claim 10, wherein said input disconnect means comprises a mechanical relay, acting as a single pole single throw switch.

15. The programmable logic device of claim 10, further including logic circuitry to cause each of said input disconnect signals to be set to "disconnect" when:
   (a) said input signal from said subset of said plurality of input channels corresponds to said input specified by said logic equation,
   (b) said properties of said lookup table include the property that exactly one of said columns of said lookup table contains any non-zero entries, and
   (c) said property has been detected, and to be set to "connect" otherwise,
   whereby inputs that are directly connected to outputs are also disconnected from the device's internal lookup table processing logic.

16. The programmable logic device of claim 10, further including logic circuitry to cause each of said input disconnect signals to be set to "disconnect" when:
   (a) said input signal from said subset of said plurality of input channels corresponds to said input specified by said logic equation, (b) said properties of said lookup table include the property that all of said columns of said lookup table which contain non-zero entries correspond to one of said outputs specified by said logic equations, and (c) said property has been detected, and to be set to "connect" otherwise, whereby inputs that are directly connected to outputs are also disconnected from the device's internal lookup table processing logic if all other outputs are always 0.

17. The programmable logic device of claim 10, further including logic circuitry to cause each of said input disconnect signals to be set to "disconnect" when:

(a) said input signal from said subset of said plurality of input channels corresponds to said input specified by said logic equation, (b) said properties of said lookup table include the property that said means of selecting some set of bits from said storage memory based on said mode and on the values of a set of inputs will, when said mode is D mode, for any combination of values of said inputs exclusive of all inputs corresponding to said inputs specified by said logic equations, select the same bits for all possible values of said inputs corresponding to said inputs specified by said logic equations, and (c) said property has been detected, and to be set to "connect" otherwise, whereby said input disconnect means will disconnect an input only if its value is not necessary to determine any outputs other than outputs which may be directly connected to inputs.

18. The programmable device of claim 10, further including a delay means so said switching means changes to the "on" state prior to said input disconnect signal being changed to "disconnect," and said switching means changes to the "off" state subsequent to said input disconnect signal being changed to "connect."

* * * * *